United States Patent
Engelhart et al.

(10) Patent No.: US 10,658,527 B2
(45) Date of Patent: May 19, 2020

(54) SOLAR CELL AND SOLAR CELL MANUFACTURING METHOD

(71) Applicant: HANWHA Q CELLS GMBH, Bitterfeld-Wolfen (DE)

(72) Inventors: Peter Engelhart, Zörbig (DE); Ansgar Mette, Leipzig (DE); Florian Stenzel, Leipzig (DE)

(73) Assignee: HANWHA Q CELLS GMBH, Bitterfeld-Wolfen (DE)

( * ) Notice: Subject to any disclaimer, the term of this patent is extended or adjusted under 35 U.S.C. 154(b) by 0 days.

(21) Appl. No.: 15/761,395

(22) PCT Filed: Aug. 9, 2016

(86) PCT No.: PCT/DE2016/100358
§ 371 (c)(1),
(2) Date: Mar. 19, 2018

(87) PCT Pub. No.: WO2017/045664
PCT Pub. Date: Mar. 23, 2017

(65) Prior Publication Data
US 2018/0261703 A1  Sep. 13, 2018

(30) Foreign Application Priority Data

Sep. 18, 2015  (DE) .................. 10 2015 115 765

(51) Int. Cl.
*H01L 31/0224* (2006.01)
*H01L 31/0216* (2014.01)
*H01L 31/18* (2006.01)

(52) U.S. Cl.
CPC ........ *H01L 31/022425* (2013.01); *H01L 31/02167* (2013.01); *H01L 31/1868* (2013.01); *Y02E 10/50* (2013.01); *Y02P 70/521* (2015.11)

(58) Field of Classification Search
CPC ....... H01L 31/022425; H01L 31/02167; H01L 31/1868
See application file for complete search history.

(56) References Cited

U.S. PATENT DOCUMENTS

| 8,686,283 B2* | 4/2014 | Heng | H01L 31/0745 136/255 |
| 2011/0284064 A1* | 11/2011 | Engelhart | H01L 31/02167 136/255 |
| 2013/0340815 A1* | 12/2013 | Kim | C23C 28/02 136/252 |
| 2014/0174518 A1* | 6/2014 | Wu | H01L 31/022425 136/256 |
| 2014/0220732 A1* | 8/2014 | Liu | H01L 31/022425 438/98 |
| 2014/0261666 A1* | 9/2014 | Stewart | H01L 31/022425 136/256 |

(Continued)

FOREIGN PATENT DOCUMENTS

| EP | 2 385 561 A2 | 5/2011 |
| EP | 2 787 541 A1 | 10/2014 |

*Primary Examiner* — Jayne L Mershon
(74) *Attorney, Agent, or Firm* — Christensen, Fonder, Dardi & Herbert PLLC

(57) ABSTRACT

A solar cell comprising: a semiconductor substrate; a metallization paste on a surface of the semiconductor substrate; and a tunneling layer between the substrate surface and the metallization paste.

6 Claims, 3 Drawing Sheets

(56) References Cited

U.S. PATENT DOCUMENTS

| | | | |
|---|---|---|---|
| 2014/0299187 A1* | 10/2014 | Chang | H01L 31/0747 136/258 |
| 2015/0027524 A1* | 1/2015 | Seyedmohammadi | H01L 31/022425 136/256 |
| 2015/0034141 A1 | 2/2015 | Albaugh et al. | |
| 2015/0075595 A1* | 3/2015 | Gall | H01L 31/065 136/255 |
| 2015/0129037 A1* | 5/2015 | Nam | H01L 31/022441 136/259 |
| 2015/0214391 A1* | 7/2015 | Hattori | H01L 31/1804 136/256 |
| 2015/0287849 A1* | 10/2015 | Kim | H01L 31/022425 136/256 |
| 2017/0077339 A1* | 3/2017 | Ma | H01L 31/0693 |

* cited by examiner

SOLAR CELL AND SOLAR CELL MANUFACTURING METHOD

CROSS REFERENCE TO RELATED APPLICATIONS

The present application is a National Phase entry of PCT Application No. PCT/DE2016/100358, filed Aug. 9, 2016 and German Patent Application No. 10 2015 115 765.9 filed Sep. 18, 2015, the disclosures of which are hereby incorporated by reference herein in their entirety.

FIELD OF THE INVENTION

The invention relates to a solar cell and to a solar cell manufacturing method. In particular, the invention relates to a solar cell having a tunnel layer and to a corresponding solar cell manufacturing method.

BACKGROUND OF THE INVENTION

In solar cells, tunnel layers serve to form efficient contacts, what are termed tunnel contacts. Tunnel layers are formed from very thin dielectric layers. For this reason, they are very sensitive to certain process steps.

By way of example, DE 10 2008 055 028 A1 describes a solar cell having a semiconductor layer with a first doping, an inducing layer arranged on the semiconductor layer, and an inversion layer or accumulation layer induced, on account of the inducing layer, beneath the inducing layer in the semiconductor layer. The inducing layer acts partially, i.e. in certain regions, locally or entirely as a tunnel layer. There is furthermore a need to improve the efficiency of the solar cell and to make the solar cell manufacturing method more cost-effective.

SUMMARY OF THE INVENTION

It is an object of the invention to provide a highly efficient solar cell and a cost-effective solar cell manufacturing method.

According to the invention, the object is achieved by a solar cell having the features of the claims and a solar cell manufacturing method having the features of the claims. Advantageous configurations and developments of the invention become apparent from the independent and subsequent dependent claims.

In order not to damage or even destroy the tunnel layer, a metal layer to be formed on the tunnel layer for extracting the solar electricity from the solar cell is usually deposited on the tunnel layer by means of a vapor deposition method. To date, a metallization paste in combination with a subsequent firing step has been deemed by experts to be too aggressive for a tunnel layer, and therefore contacting of the solar cell on the tunnel layer by means of paste metallization has not been considered. However, the invention is based on the knowledge that, given a suitable material selection and process control, the paste metallization or the metallization paste used, which produces the paste metallization during the heat treatment of a semiconductor substrate provided with the metallization paste, does not attack a tunnel layer desired on the semiconductor substrate, for example does not decompose or destroy it by virtue of its constituents. This knowledge is new, since, for a rear-side passivation of a PERC cell, use is conventionally made of what is termed "paste corrosion protection", formed for example by $SiN_x$ (silicon nitride).

The process control avoids the usual aggression of the metallization paste and therefore the decomposition or destruction of the tunnel layer on the semiconductor substrate during the solar cell manufacturing method. The formation of a tunnel layer between the semiconductor substrate and the paste metallization can be achieved, according to the invention, in that the metallization paste which is applied to the semiconductor substrate and produces the paste metallization during the heat treatment contains a constituent such as, for example, glass frit, which produces the tunnel layer between the semiconductor substrate and the paste metallization during the heat treatment of the semiconductor substrate provided with the metallization layer. The invention therefore affords highly efficient tunnel contacts with a cost-effective metallization method.

The invention relates to a solar cell which comprises a semiconductor substrate, a paste metallization arranged on a substrate surface of the semiconductor substrate, and a tunnel layer arranged between the substrate surface and the paste metallization. The solar cell is highly efficient. It combines a tunnel contact with a contact metallization in the form of a paste metallization. The tunnel layer may moreover exert a passivating action on the semiconductor surface, i.e. may be formed as a passivation layer.

A paste metallization differs from a metallization in the form of a metal thin film, which is usually produced by means of physical or chemical deposition methods, for example with plasma enhancement: the paste metallization is produced by applying a metallization paste, such as for example an aluminum paste, to the semiconductor substrate, for example by means of screen printing, and then subjecting the semiconductor substrate together with the applied metallization paste to a heat treatment process, such as a firing process, in which it is exposed to a temperature of several hundred degrees Celsius, such that the paste metallization is formed from the metallization paste.

The different production of the metallization increases the porosity of the paste metallization compared to the metal thin film, even if the same metal, for example aluminum, is used. The porosity of the paste metallization thus differs from that of a metal thin film which is deposited by means of thin film technology, such as physical vapor deposition (PVD, e.g. sputtering, vapor deposition). The paste metallization typically has a porosity of more than 30% or 40% or 50% or 60% or 70%, whereas the metal thin film deposited by means of thin film technology has a porosity of close to 0%. The porosity represents the ratio of cavity volume to overall volume of the paste metallization, or of the metal thin film.

The paste metallization has a particle and pore structure of typically 1 μm to several 10 μm. Furthermore, a layer thickness of the paste metallization may be in the range of between 5 μm and 40 μm, whereas the layer thickness of a metal thin film deposited by means of thin film technology is usually less than 5 μm. Furthermore, the paste metallization has a higher resistivity (typically higher by a factor of 1.5 to 10) than a metal thin film deposited by means of thin film technology. By way of example, the resistivity of an aluminum thin film deposited by means of thin film technology is $2.65*10^{-2}$ □ $mm^2/m$, whereas the resistivity of an aluminum paste metallization is in the range of 10 to $25*10^{-2}$ □ $mm^2/m$.

A further difference between the paste metallization and a thin film is its composition: whereas the purity of a metal thin film deposited by means of thin film technology is typically greater than 99%, the paste metallization typically has a purity of less than 98%. The paste metallization contains glass, organic substances and the like.

The tunnel layer present in the solar cell according to the invention is preferably a dielectric layer in which there are precipitates present. A precipitate is a precipitation or clumping of quantities of substance such as, for example, lead or lead glass. The term "quantity of substance" indicates that the substance is not a quantity which represents an impurity. As will be explained hereinbelow with reference to the solar cell manufacturing method, during the firing of the semiconductor provided with a metallization paste for producing the paste metallization, substances diffuse into the tunnel layer, and form the precipitates.

The semiconductor substrate is preferably an n-type or p-type silicon wafer. In addition to the precipitates, the tunnel layer preferably comprises thermal silicon dioxide ($SiO_2$), wet-chemical $SiO_x$, ozone ($O_3$), strengthened $SiO_x$, amorphous silicon (a-Si) or aluminum oxide ($AlO_x$). Thermal $SiO_2$ is $SiO_2$ produced by thermal oxidation of silicon. Wet-chemical $SiO_x$ is $SiO_x$ produced by wet-chemical etching, for example by means of hydrofluoric acid-nitric acid mixtures of silicon. Native $SiO_x$ can be strengthened at the silicon interface by ozone, or an $SiO_2$ layer can be produced or strengthened by the reaction activity of ozone. This means that $O_3$-strengthened $SiO_2$ is $SiO_2$ produced using $O_3$. The tunnel layer preferably has a thickness of less than 5 nm, preferably of less than 3 nm, more preferably of less than 2 nm.

The paste metallization preferably comprises aluminum (Al) and/or silver (Ag). It may furthermore contain glass, glass frit and/or precipitates such as, for example, lead. The paste metallization preferably has a thickness of between 5 µm and 40 µm, preferably of between 5 µm and 20 µm, more preferably of between 5 µm and 10 µm. The paste metallization may comprise a plurality of paste metallizations, which are arranged locally and as a whole cover the substrate surface over part or all of its surface area.

In a preferred embodiment, the tunnel layer and the paste metallization are arranged on a rear-side substrate surface of the semiconductor substrate. The front-side substrate surface of the semiconductor substrate represents the light incidence side of the solar cell, whereas the rear-side substrate surface of the semiconductor substrate represents that side of the solar cell which is remote from the light incidence side.

The tunnel layer and/or the paste metallization are preferably arranged over all of the surface area of the substrate surface of the semiconductor substrate. In other words, they cover substantially the entire substrate surface.

Alternatively, the tunnel layer and/or the paste metallization are preferably structured. This means that the tunnel layer and/or the paste metallization are arranged locally on the substrate surface of the semiconductor substrate. The structured tunnel layer is configured in such a manner that at least one local contact is present between the semiconductor substrate and the paste metallization. The presence of a structured tunnel layer and of a structured paste metallization makes it possible to save material; moreover, materials used for these layers can be optimally matched to one another.

It is preferable that the tunnel layer is structured and surrounded by a passivation layer arranged on the substrate surface. The passivation layer is preferably a dielectric passivation layer. By way of example, it comprises aluminum oxide ($AlO_x$) or silicon nitride ($SiN_x$). It has an electrically insulating action, whereas the structured tunnel layer is configured in such a manner that at least one local contact is present between the semiconductor substrate and the paste metallization. The passivation layer may have a thickness which is the same as or greater than the thickness of the tunnel layer.

In a preferred embodiment, the paste metallization is structured and surrounded by a further paste metallization arranged on the substrate surface. By way of example, the paste metallization is configured for forming or contacting over the tunnel layer, whereas the further paste metallization is formed in a manner optimized for an intermediate contact metallization.

A doping layer is preferably arranged beneath the tunnel layer. The doping layer is a doped n-type or p-type semiconductor interface.

In a preferred embodiment, at least one intermediate layer is arranged between the tunnel layer and the paste metallization. The intermediate layer preferably has a refractive index which is lower than the refractive index of crystalline silicon. The intermediate layer more preferably has a refractive index of less than 3, yet more preferably of less than 2. The intermediate layer preferably has a thickness of at least 20 nm, more preferably at least 50 nm, yet more preferably at least 100 nm. It preferably acts as an optical infrared mirror.

The intermediate layer is preferably electrically conductive. The intermediate layer may be single-layered. Alternatively, the intermediate layer is multi-layered. By way of example, the intermediate layer comprises a first sub-layer and a second sub-layer. The first sub-layer is preferably a doped semiconductor, for example n-doped or p-doped amorphous silicon (a-Si) or polycrystalline silicon (polysilicon or poly-Si), whereas the second sub-layer is preferably an optically predominantly transparent and conductive layer, i.e. a TCO layer ("transparent conductive oxide"). The second sub-layer is, for example, a fluorine-tin-oxide layer, an aluminum-zinc-oxide layer, or an antimony-tin-oxide layer, preferably an indium-tin-oxide layer.

The invention furthermore relates to a solar cell manufacturing method, comprising the following steps: providing a semiconductor substrate, producing a tunnel layer on a substrate surface of the semiconductor substrate, applying a metallization paste to the substrate surface, and heat-treating the semiconductor substrate in such a manner that a paste metallization having a tunnel contact connection to the semiconductor substrate through the tunnel layer is formed from the metallization paste. This solar cell manufacturing method is cost-effective.

The tunnel layer is preferably produced on account of the heat treatment. During the heat treatment, it is preferable that precipitates are formed in the tunnel layer, these diffusing, for example, from glass and/or glass frit present in the metallization paste into the tunnel layer. By way of example, during the heat treatment, the lead present in the glass diffuses from the metallization paste to the boundary layer between the semiconductor (e.g. Si) and the metallization paste, and lead precipitates in the tunnel layer.

In a preferred embodiment, the metallization paste contains a tunnel layer precursor, which forms or produces the tunnel layer during the heat treatment. In addition to the tunnel layer precursor, the metallization paste preferably contains a paste metallization precursor, for example in the form of metal grains.

By way of example, the metallization paste contains aluminum and/or silver as paste metallization precursor and glass and/or glass frit as tunnel layer precursor. In addition to the paste metallization precursor and the tunnel layer precursor, the metallization paste preferably contains solvents and/or binders. The metallization paste preferably contains aluminum in a proportion by weight of 40%-80%, preferably 70%-78%, glass and/or glass fit with the following metals or a mixture of said metals: tellurium, lead, zinc, barium, tungsten, bismuth, with the proportion of the glass frit being less than 2% by weight, preferably less than 1% by weight, based on the total metallization paste, and solvents and/or binders.

The heat treatment comprises heating of the semiconductor substrate coated as described above to between 300° C. and approximately 800° C. at a rate of 50-100 K/s. Then, the coated semiconductor substrate is cooled to 500° C. at a cooling rate of 50-100 K/s.

BRIEF DESCRIPTION OF THE DRAWINGS

Herein below, the invention will be explained in more detail with reference to drawings, in which.

DETAILED DESCRIPTION

Figure 1:
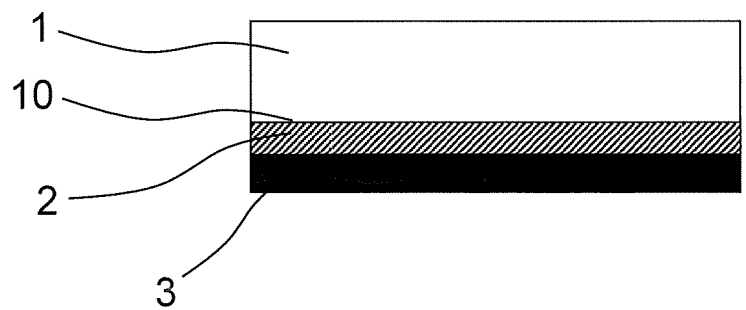
FIG. 1 schematically shows a cross-sectional view of a solar cell in a first embodiment.

FIG. 1 schematically shows a cross-sectional view of a solar cell in a first embodiment. The solar cell comprises a semiconductor substrate 1, a tunnel layer 2 and a paste metallization 3. The paste metallization 3 is arranged on a substrate surface 10 of the semiconductor substrate 1. The tunnel layer 2 is arranged between the substrate surface 10 and the paste metallization 3. Both the tunnel layer 2 and the paste metallization 3 are layers formed over the entire surface area. The tunnel layer 2 and the paste metallization 3 are arranged on the rear-side substrate surface 10 of the semiconductor substrate 1, which is an n-type or p-type silicon wafer.

Figure 2:
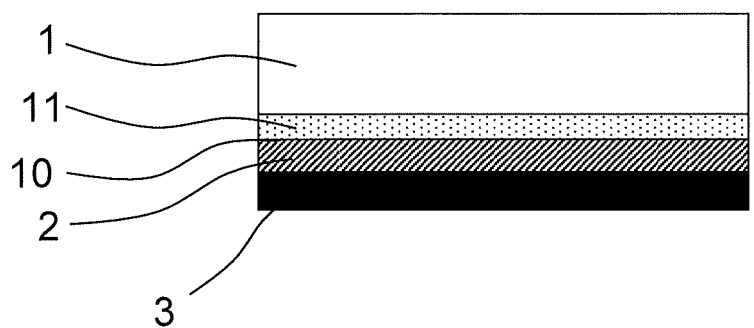
FIG. 2 schematically shows a cross-sectional view of a solar cell in a second embodiment.

FIG. 2 schematically shows a cross-sectional view of a solar cell in a second embodiment. The solar cell shown in FIG. 2 corresponds to the solar cell shown in FIG. 1, with the difference that a doping layer 11 is arranged beneath the tunnel layer 2, such that the doping layer 11 is arranged between the semiconductor substrate 1 and the tunnel layer 2 and comprises the substrate surface 10. The doping layer 11 represents an n-doped or p-doped interface of the semiconductor substrate 1 in the form of an n-type or p-type silicon wafer.

Figure 3:
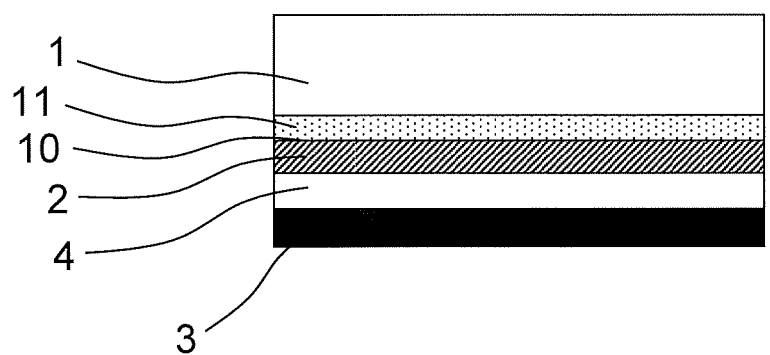
FIG. 3 schematically shows a cross-sectional view of a solar cell in a third embodiment.

FIG. 3 schematically shows a cross-sectional view of a solar cell in a third embodiment. The solar cell shown in FIG. 3 corresponds to the solar cell shown in FIG. 2, with the difference that an intermediate layer 4 is arranged between the tunnel layer 2 and the paste metallization 3. The intermediate layer 4 is electrically conductive. It has a refractive index which is lower than the refractive index of crystalline silicon.

Figure 4:
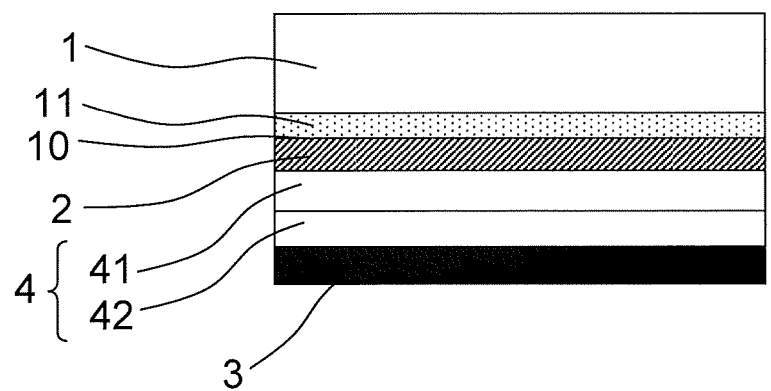
FIG. 4 schematically shows a cross-sectional view of a solar cell in a fourth embodiment.

FIG. 4 schematically shows a cross-sectional view of a solar cell in a fourth embodiment. The solar cell shown in FIG. 4 corresponds to the solar cell shown in FIG. 3, with the difference that the intermediate layer 4 is formed from a first sub-layer 41 and a second sub-layer 42. The first sub-layer 41 is an n-doped or p-doped amorphous silicon layer (a-Si layer) or a polycrystalline silicon layer (poly-Si layer). The second intermediate layer 42 is a TCO layer.

Figure 5:
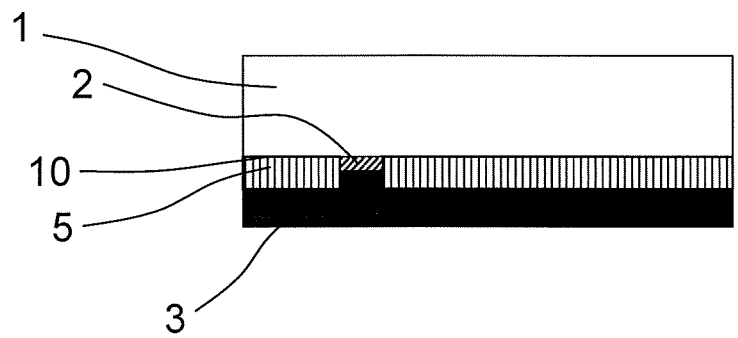
FIG. 5 schematically shows a cross-sectional view of a solar cell in a fifth embodiment.

FIG. 5 schematically shows a cross-sectional view of a solar cell in a fifth embodiment. The solar cell shown in FIG. 5 corresponds to the solar cell shown in FIG. 1, with the difference that the tunnel layer 2 is structured and surrounded by a passivation layer 5 arranged on the substrate surface 10. The tunnel layer 2 is in the form of a local contact between the semiconductor substrate 1 and the paste metallization 3. The thickness of the passivation layer 5 is greater than the thickness of the tunnel layer 2.

Figure 6:
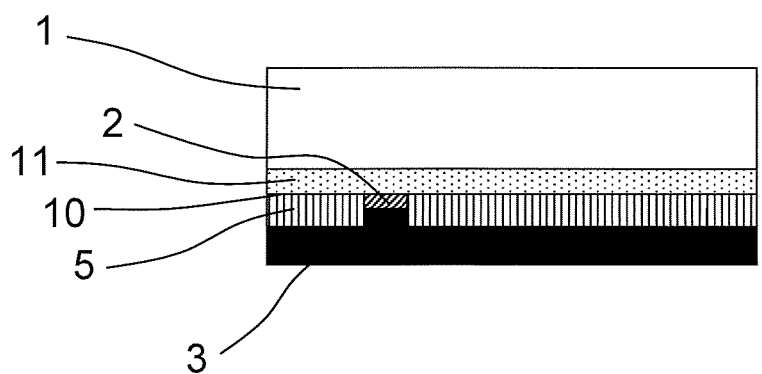
FIG. 6 schematically shows a cross-sectional view of a solar cell in a sixth embodiment.

FIG. 6 schematically shows a cross-sectional view of a solar cell in a sixth embodiment. The solar cell shown in FIG. 6 corresponds to the solar cell shown in FIG. 5, with the difference that a doping layer 11 is arranged beneath the structured tunnel layer 2 and the passivation layer 5 surrounding the latter, such that the doping layer 11 is arranged between the semiconductor substrate 1 and the structured tunnel layer 2 and also the passivation layer 5 surrounding the latter, and comprises the substrate surface 10. The doping layer 11 represents an n-doped or p-doped interface of the semiconductor substrate 1 in the form of an n-type or p-type silicon wafer.

Figure 7:
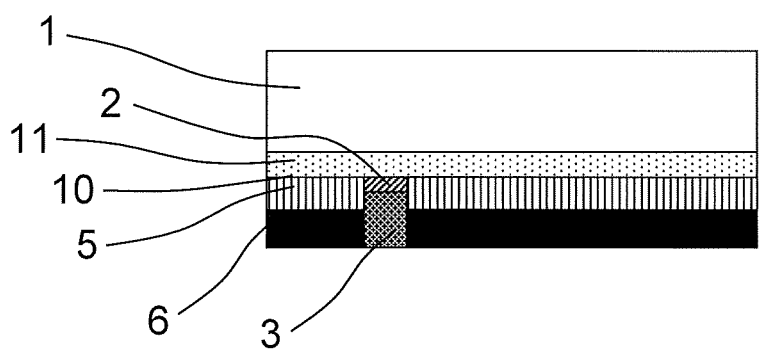
FIG. 7 schematically shows a cross-sectional view of a solar cell in a seventh embodiment.

FIG. 7 schematically shows a cross-sectional view of a solar cell in a seventh embodiment. The solar cell shown in FIG. 7 corresponds to the solar cell shown in FIG. 6, with the difference that the paste metallization 3 is structured and surrounded by a further paste metallization 6 arranged on the substrate surface 10, in particular the passivation layer 5. Like the tunnel layer 2, the paste metallization 3 is configured as a local layer. The paste metallization 3 is arranged locally on the tunnel layer 2, whereas the further paste metallization 6 is arranged on the passivation layer 5.

Figure 8:
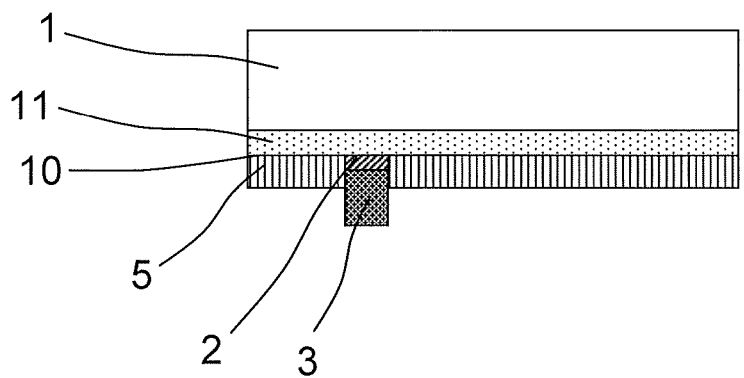
FIG. 8 schematically shows a cross-sectional view of a solar cell in an eighth embodiment.

FIG. 8 schematically shows a cross-sectional view of a solar cell in an eighth embodiment. The solar cell shown in FIG. 8 corresponds to the solar cell shown in FIG. 6, with the difference that the paste metallization 3 is structured. The paste metallization 3 is arranged locally on the tunnel layer 2.

Figure 9:
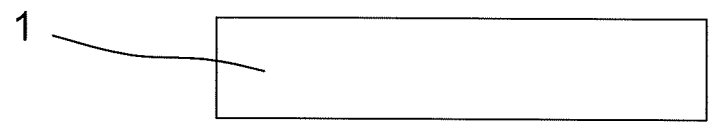
FIGS. 9 to 11 schematically show a solar cell manufacturing method.
Figure 10:
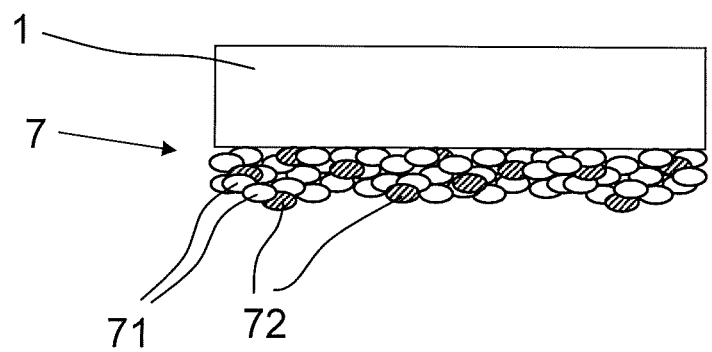
Figure 11:
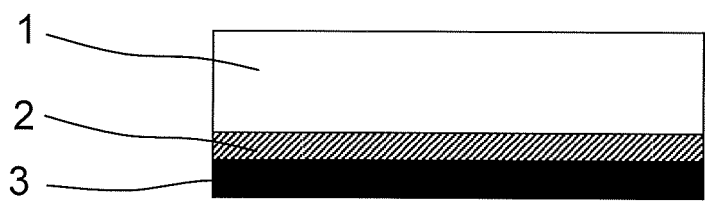

FIGS. 9 to 11 schematically show a solar cell manufacturing method. Firstly, as shown in FIG. 9, a semiconductor substrate 1 is provided. As shown in FIG. 10, a metallization paste 7 is then applied to the substrate surface 10, the metallization paste 7 containing metal grains 71 as paste metallization precursor and a tunnel layer precursor 72. FIG. 11 schematically shows a solar cell which is obtained after heat-treating the semiconductor substrate 1 provided with the metallization paste 7. The heat treatment is effected in such a manner that a paste metallization 3 is formed from the metallization paste 7, with the tunnel layer 2 being produced on account of the heat treatment on the substrate surface 10 of the semiconductor substrate 1, such that it is arranged between the semiconductor substrate 1 and the paste metallization 3, and the paste metallization 3 having a tunnel contact connection to the semiconductor substrate 1 through the tunnel layer 2.

The metal grains 71 form the metallization paste 3 during the heat treatment, whereas the tunnel layer precursor 72 forms the tunnel layer 2 during the heat treatment. The solar cell shown in FIG. 11 comprises the semiconductor substrate 1, the paste metallization 3, and the tunnel layer 2 arranged between the semiconductor substrate 1 and the paste metallization 3.

Figure 12:
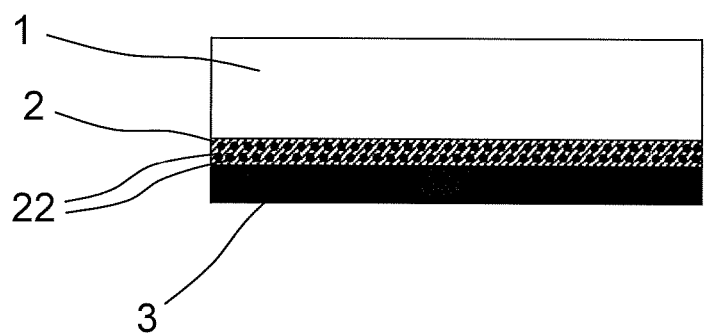
FIG. 12 schematically shows a further embodiment of a solar cell.

FIG. 12 schematically shows a further configuration of the solar cell which can be produced by means of the manufacturing method. By using black dots, FIG. 12 schematically shows that the tunnel layer 2 comprises precipitates 22 which have migrated or diffused from the metallization paste into the tunnel layer 2 during the heat treatment.

LIST OF REFERENCE SIGNS

1 Semiconductor substrate
10 Substrate surface
11 Doping layer
2 Tunnel layer
22 Precipitates
3 Paste metallization
4 Intermediate layer
41 First sub-layer
42 Second sub-layer
5 Passivation layer
6 Further paste metallization
7 Metallization paste
71 Metal grain
72 Tunnel layer precursor

The invention claimed is:

1. A solar cell comprising:
  a semiconductor substrate;
  a paste metallization arranged on a substrate surface of the semiconductor substrate; and
  a tunnel layer arranged between the substrate surface and the paste metallization and being a dielectric layer in which there are precipitates present;
  wherein the paste metallization and the tunnel layer are in direct contact with one another, and the paste metallization and the tunnel layer cover substantially the entire substrate surface.

2. The solar cell as claimed in claim 1, wherein the tunnel layer and the paste metallization are arranged on a rear-side substrate surface of the semiconductor substrate.

3. The solar cell as claimed in claim 1, wherein a doping layer is arranged beneath the tunnel layer.

4. A solar cell manufacturing method, comprising the following steps:
  providing a semiconductor substrate;
  producing a dielectric tunnel layer on a substrate surface of the semiconductor substrate;
  applying a metallization paste containing glass and/or glass frit as a tunnel layer precursor to the substrate surface such that the metallization paste is in direct contact with the dielectric tunnel layer; and
  heat-treating the semiconductor substrate in such a manner that a paste metallization having a tunnel contact connection to the semiconductor substrate through the dielectric tunnel layer is formed from the metallization paste by forming precipitates in the dielectric tunnel layer by diffusing from glass and/or glass frit present in the metallization paste into the dielectric tunnel layer,
  wherein the dielectric tunnel layer and the paste metallization are formed by the method to be arranged over all of the surface area of the substrate surface of the semiconductor substrate.

5. The solar cell manufacturing method as claimed in claim 4, wherein the tunnel layer is produced on account of the heat treatment.

6. The solar cell manufacturing method as claimed in claim 5, wherein the metallization paste contains a tunnel layer precursor, which forms the tunnel layer during the heat treatment.

* * * * *